United States Patent
Dawson et al.

(10) Patent No.: US 6,307,322 B1
(45) Date of Patent: Oct. 23, 2001

(54) THIN-FILM TRANSISTOR CIRCUITRY WITH REDUCED SENSITIVITY TO VARIANCE IN TRANSISTOR THRESHOLD VOLTAGE

(75) Inventors: Robin Mark Adrian Dawson, Princeton; Zilan Shen, W. Windsor; Alfred Charles Ipri, Princeton, all of NJ (US); Roger Green Stewart, Morgan Hill, CA (US); Michael Gillis Kane, Skillman, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/473,504

(22) Filed: Dec. 28, 1999

(51) Int. Cl.[7] .................................................. G09G 3/30
(52) U.S. Cl. ................................. 315/169.1; 315/169.3; 345/76
(58) Field of Search .............................. 315/169.1, 169.3; 345/76, 77

(56) References Cited

U.S. PATENT DOCUMENTS

| | | |
|---|---|---|
| 4,042,854 | 8/1977 | Luo et al. . |
| 4,393,380 | 7/1983 | Hosokawa et al. . |
| 4,471,347 | 9/1984 | Nakazawa et al. . |
| 4,602,192 | 7/1986 | Nomura et al. . |
| 4,928,095 | 5/1990 | Kawahara . |
| 5,079,483 | 1/1992 | Sato . |
| 5,408,109 | 4/1995 | Heeger et al. . |
| 5,652,600 | 7/1997 | Khormaei et al. . |

*Primary Examiner*—David Vu
(74) *Attorney, Agent, or Firm*—William J. Burke

(57) ABSTRACT

A circuit design technique polysilicon thin-film transistor (TFT) circuitry produces circuits that are relatively less sensitive to threshold variations among the TFT's than circuits designed using conventional techniques. The circuit is designed such that thin-film transistors that are sensitive to threshold variations are made larger than other thin-film transistors in the circuitry to minimize threshold variations among similar transistors implemented in the circuit. In one embodiment, a pixel structure for an active matrix display device implemented in polysilicon includes two transistors, a select transistor and a drive transistor. The drive transistor in the pixel structure is a thin film metal oxide silicon (MOS) transistor that includes a gate to source capacitance sufficient to hold an electrical potential which keeps the transistor in a conducting state for an image field interval. One embodiment of the pixel structure includes only the select transistor and the drive transistor. The pixel storage capacitance is entirely realized by the gate to source capacitance of the drive transistor. Another embodiment of the pixel structure includes a capacitor which is much smaller than the capacitor of a conventional active matrix pixel structure. This capacitor holds the pixel in a non-illuminated state when the drive transistor is turned off. This pixel structure may be used with any display technology that uses an active matrix and stores image data on a capacitance in the pixel, including without limitation, organic light emitting diodes, electroluminescent devices, and inorganic light emitting diodes.

13 Claims, 4 Drawing Sheets

THIN-FILM TRANSISTOR CIRCUITRY WITH REDUCED SENSITIVITY TO VARIANCE IN TRANSISTOR THRESHOLD VOLTAGE

This invention was made with Government support under Contract No. F33615-96-2-1944 awarded by the Department of the Air Force. The Government has certain rights in this invention.

BACKGROUND OF THE INVENTION

This invention concerns electronic circuitry which uses thin-film transistors (TFT's) and, in particular, circuitry which uses polysilicon TFT's in designs that are sensitive to the gate to source threshold voltage of the TFT's.

Display technology pervades all aspects of present day life, from televisions to automobile dashboards to laptop computers to wristwatches. At the present time, cathode-ray tubes (CRTs) dominate display applications in the 10–40 inch (diagonal) display size. CRTs, however, have many disadvantages including weight, lack of ruggedness, cost, and the need for very high driving voltages.

Recently, passive-matrix liquid-crystal displays (PMLCDs) and active-matrix liquid crystal displays (AMLCDs) have become dominant in midrange display applications because of their use in lap-top computers. For smaller pixel sizes and also for large projection displays, the AMLCD is becoming increasingly important. A major drawback of AMLCDs, however, is the requirement of a backlight, usually a fluorescent light source, that substantially increases the size and weight of the display. It also leads to reduced efficiency since the back illumination is applied continuously even for pixels in the off state.

Another type of display, an active matrix electroluminescent (AMEL) display, emits light by passing a current through a light emitting material. In the case of an AMEL display, an alternating current (AC) is passed through an inorganic light emitting material. The inorganic light emitting material is arranged such that dielectrics are present on either side of the emitting material. Relatively high voltages are required to generate sufficient light from the electroluminescent (EL) material. The relatively high voltages are typically between 100–200 volts.

Yet another type of active matrix display uses light emitting diodes (LED's) or organic light emitting diodes (OLED's). Only the devices that correspond to illuminated pixels are drawing power. Accordingly, displays which use LED's or OLED's may provide better power efficiency for equivalent illumination. Both LED's and OLED's are advantageously implemented in an active matrix configuration to form AMLED and AMOLED displays.

Each pixel in an active matrix display includes at least one and typically two thin film transistors (TFT's). The thin film transistor receives video data from a column driver on the display when the display row containing the pixel is selected. The TFT stores the received video data onto the capacitance of the pixel.

One material which may be used to form active matrix LCD displays is polysilicon. It is difficult to design peripheral circuitry, such as column drivers, with TFT's, however, because field effect transistors made from polysilicon exhibit different turn-on thresholds. The turn-on threshold of a metal oxide semiconductor (MOS) transistor is the gate to source voltage, VGS, needed to establish a conductive path between the source and the drain. Variation in the turn-on threshold for the polysilicon thin-film transistors is a problem which affects both the pixel structure and peripheral circuitry of AMEL, AMLED and AMOLED technologies. It also affects AMLCD displays in which a portion of the peripheral circuitry is implemented in thin-film transistors.

Displays which use OLED devices for the pixels, moreover, have another problem. OLED devices are current-mode devices, that is to say, the amount of light emitted by an OLED varies with the current that is conducted by the OLED. To form a gray-scale OLED display, it is desirable to carefully control the current that flows through each pixel. Polysilicon threshold variation complicates this task causing OLED pixel circuits to be designed with four or more transistors to minimize the effect of threshold variation and, so, improve the uniformity of the displayed images. Some of these pixel structures are described in copending patent application Ser. No. 09/064,696 entitled ACTIVE MATRIX LIGHT EMITTING DIODE PIXEL STRUCTURE AND CONCOMITANT METHOD.

The addition of transistors to the pixel structure, however, has a negative impact on device yield and also reduces the portion of the pixel area that emits light, reducing the brightness of the display.

SUMMARY OF THE INVENTION

The present invention is embodied in a circuit design technique polysilicon thin-film transistor (TFT) circuitry which is sensitive to threshold variations among the TFT's used to implement the circuitry. The circuit is designed such that thin-film transistors that are sensitive to threshold variations are made larger than other thin-film transistors in the circuitry to minimize threshold variations among similar transistors implemented in the circuit.

According to one aspect of the invention, the circuitry is the pixel structure of an active matrix display. The pixel structure includes two transistors, a select transistor which is active when data is being written to the pixel and a drive transistor that is sensitive to threshold variations.

According to another aspect of the invention, the drive transistor in the pixel structure includes a capacitance sufficient to hold an electrical potential that keeps the transistor in a conducting state for an image field interval.

According to yet another aspect of the invention, the pixel structure includes only the select transistor and the drive transistor. The pixel storage capacitance is entirely realized by the gate to channel capacitance of the drive transistor.

According to another aspect of the invention, the pixel structure includes a capacitor which is smaller than the capacitor of a conventional active matrix pixel structure. This capacitance holds the pixel in a non-illuminated state when the drive transistor is turned off.

According to yet another aspect of the invention, the pixel structure is used for an AMOLED display and the charge value stored on the gate to source capacitance of the drive transistor controls the level of current that is applied to the OLED device.

According to yet another aspect of the invention, the larger drive transistor has the same width to length ratio as the drive transistor of a conventional active matrix display.

DETAILED DESCRIPTION

In circuitry that is designed with TFT's the device geometry of each transistor is determined by a number of factors including the minimum line size of the process being used, the amount of current that a particular transistor will need to handle and other topological factors such as the relative placement of components, the conductivity of the polysilicon and the distribution of operational power and reference signals in the circuit. Collectively, these factors are known as design rules.

According to one aspect of the present invention, circuits that are designed with polysilicon TFT's are analyzed to determine which transistors are sensitive to variations in their gate to source threshold potentials. These transistors are then scaled up from the sizes indicated by the design rules to produce larger transistors having similar transfer characteristics but which exhibit less variation in gate to source threshold potentials than transistors formed according to the design rules.

The exemplary embodiment of the invention is described with reference to a display device that uses a deposited polysilicon film to form pixel structures from p-channel thin-film transistors (TFT's). In the exemplary embodiment of the invention, the pixel structures include organic light emitting diodes (OLED's) which emit light to form an image. It is contemplated, however, that the invention may be practiced with other types of circuitry, for example, circuits that employ differential amplifiers or current mirrors. In addition, the present invention may be practiced with display devices that employ other semiconductor films which exhibit threshold variation and that the TFT's formed from the film may be either p-channel or n-channel devices. The pixel structure is also applicable to displays which use electroluminescent (EL), light-emitting diode (LED) display materials or with any other type of display element that can be implemented in an active matrix display structure and that is sensitive to threshold variance among the TFT's that implement the circuit or that relies on charge stored in the pixel structure. In the materials that follow, pixels formed from these display materials are referred to generically as active pixel elements.

Figure 1:
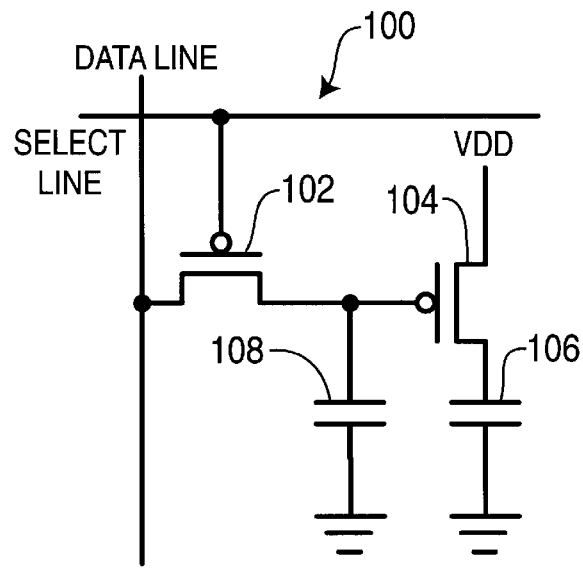
FIG. 1 (prior art) is a schematic diagram of an exemplary electroluminescent pixel cell.

FIG. 1 shows an exemplary two transistor pixel structure which may be used in an EL pixel structure. This pixel structure includes a select transistor 102, a driver transistor 104, an EL element 106 and a storage capacitor 108. The source electrode of the select transistor 102 is coupled to the data line, its gate electrode is coupled to the select line and its drain electrode is coupled to one end of the capacitor 108 and the gate electrode of the driver transistor 104. The source electrode of the driver transistor 104 is coupled to a source of operational potential (e.g. VDD) and its drain electrode is coupled to the anode of the EL element. The other end of the capacitor 108 and the cathode of the EL element are coupled to a source of reference potential (e.g. ground).

In operation, image data is written into the pixel cell by bringing the select line logic-low to turn on transistor 102 while an electrical potential corresponding to a desired illumination level for the pixel is applied to the data line. When transistor 102 is turned on, the potential applied to the data line is applied to the gate electrode of the drive transistor 104 and is stored on the capacitor 108. This electrical potential turns on transistor 104, causing it to apply the potential VDD to the anode of the inorganic EL element 106, causing the element 106 to emit light.

While the structure shown in FIG. 1 is suitable for an EL or LCD display, it is not suitable for an OLED display. As described above, the amount of light emitted by an OLED display element is a function of the level of current applied to the element. If a structure such as that shown in FIG. 1 were used for in an OLED device, variations in the level of the operational supply voltage, VDD, may cause corresponding variations in the brightness of the pixel. The voltage VDD may vary due to interfering electrical signals (noise) or due to the switching of the display when rows of image data are being stored.

Figure 2:
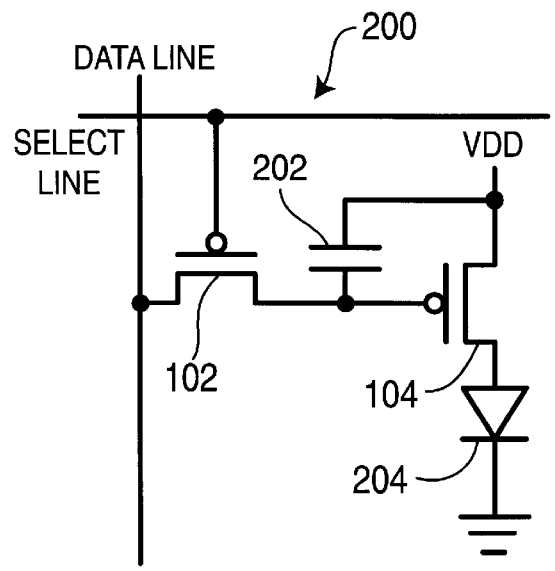
FIG. 2 (prior art) is a schematic diagram of a simple OLED pixel cell.

The pixel structure shown in FIG. 2 overcomes this problem by configuring the storage capacitor 202 between the source and the gate electrodes of the driver transistor 104. In this configuration, when the elect line activates transistor 102, the pixel data voltage on the data line is stored on the capacitor 202 which provides that stored voltage as the gate to source potential (VGS) to the transistor 104. After the line is deselected, this voltage remains on the capacitor causing the transistor 104 to provide a substantially constant current level to the OLED 204 during the ensuing image field interval. Because the image data is relative to the supply voltage VDD, variations in the supply voltage do not affect the brightness of the OLED 204. A pixel structure of the type shown in FIG. 2 is described in U.S. Pat. No. 5,550,066 entitled METHOD OF FABRICATING A TFT-EL PIXEL.

As described above, the current, flowing through the OLED 204 determines its brightness. If the drain voltage of transistor 104 is sufficiently saturate the transistor, the current through the OLED element is given by equation (1).

$$I_{OLED} = \frac{K'}{2} \frac{W}{L} (V_g - V_t)^2 \quad (1)$$

where K' is the intrinsic transconductance parameter of transistor 104, W and L are the length and width of the transistor $V_g$ is the gate to source potential applied to the drive transistor 106 and $V_t$ is the gate to source threshold voltage of the drive transistor 104.

The turn-on voltage of the OLED element 204 can vary over its lifetime. One of the useful features of the two-transistor pixel structure shown in FIG. 2 is that the current through transistor 104 is relatively insensitive to variations in the turn-on voltage of the OLED because the OLED 204 is coupled between the drain electrode of transistor 104 and ground. Because the pixel structure is implemented in polysilicon, however, the threshold voltage of the transistors 102 and 104 may be different for different pixels in the same display device. This is not a problem for transistor 102 as it is simply turned on or off and can be provided with an overdrive potential via the select line that ensures it operates correctly for different threshold voltages. Transistor 104, however, is more sensitive to changes in its threshold voltage as this transistor determines the current flow through the OLED 204 as shown by equation (1). It is important to note that the subject invention corrects pixel-to-pixel variations in gate to source threshold voltages. Any change in threshold voltage which affects the entire display is compensated for by circuitry external to the pixel structure, as described in the above referenced patent and patent application.

The inventors have determined that TFT's formed from polysilicon that have a relatively large area tend to exhibit lower variations in the gate to source threshold voltage than transistors having a smaller area. For example, a transistor having a width to length ratio (W/L) of 10 $\mu$m/4 $\mu$m has a standard deviation in its gate to source threshold voltage of approximately one volt. A transistor having a W/L of 100 $\mu$m/8 $\mu$m, however, has a standard deviation of only approximately 0.1 v. It is believed that the threshold variation is due to the interaction between polysilicon grains within the transistor and the electrical conduction through the device. Thus, a larger device provides more grains in the transistor which tend to average out the threshold variations among the transistors. In the exemplary embodiment of the invention, the scaled-up drive transistor 104 has an area of approximately 125 $\mu$m$^2$ and the grain size of the polysilicon is approximately 1 $\mu$m.

Another advantage of using a larger drive transistor in the pixel structure is that the capacitor 202 may be reduced in size or eliminated. This is because the transistor, when it is turned on, acts as if a capacitor were connected between the gate electrode and the source electrode. This is useful because, as shown in FIG. 3, the area of the transistor 302 may be increased and the capacitor 304 (shown in phantom) coupled between the source and gate electrodes of the transistor 302 may be eliminated or at least made smaller, producing a pixel structure that has approximately the same fill factor as for the pixel structure shown in FIG. 2.

As can be seen from equation (1), it is desirable for the W/L ratio of the transistor 302 to be approximately the same as the W/L ratio of the transistor shown in FIG. 2. This ensures that the current provided to the OLED will be approximately the same because the current applied to the OLED is proportional to the W/L ratio of the drive transistor.

When the W/L ratio is preserved, and the gate to source capacitance is at least 100 femtofarads (fF), approximately the same current level is provided to the OLED 204 during the field interval as is provided by the pixel structure shown in FIG. 2. In addition, the fill factor of the pixel structure remains the same because the area occupied by the capacitor in the pixel structure of FIG. 2 is at least partially occupied by the larger drive transistor 302 of the pixel structure shown in FIG. 3.

Figure 3:
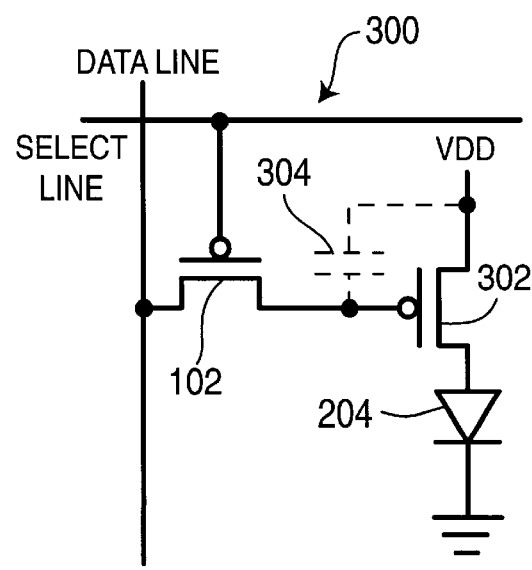
FIG. 3 is a schematic diagram of an first embodiment of an OLED pixel cell according to the present invention.

One concern with the pixel structure shown in FIG. 3 is the reduction in the storage capacitance when the drive transistor 302 is turned off. This corresponds to a pixel that is turned off, i.e. a dark pixel on the display. The reduction in pixel capacitance when the pixel structure shown in FIG. 3 is turned off may cause the pixel to erroneously turn on during the frame interval. Accordingly, it may be desirable to include a small capacitor 304 (shown in phantom) in the pixel structure shown in FIG. 3 in order to maintain the pixel in an off state for a field interval after it has been turned off. In the exemplary embodiment of the invention, the inventors have determined a capacitor 304 having a capacitance of as little as 10 fF is sufficient to hold the pixel in to an "off" state.

Figure 4:
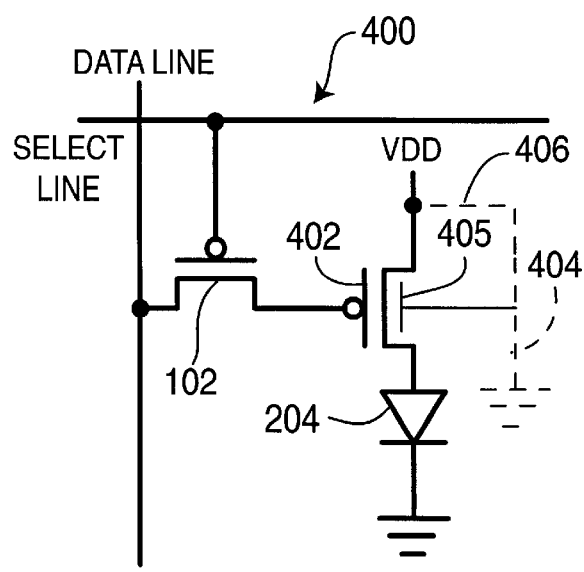
FIG. 4 is a schematic diagram of a second embodiment of an OLED pixel cell according to the present invention.

The capacitor 304 may be explicitly implemented in the pixel structure, as shown in FIG. 3, or it may be implicitly implemented as a capacitance between the gate electrode of the TFT and the substrate or ground plane on which the TFT's are formed. This structure is illustrated in FIG. 4. As shown in FIG. 4, the TFT 402 is formed between the gate electrode and a body connection 406 between the TFT and VDD. This effectively forms a capacitor between the gate electrode of transistor 402 and VDD even when transistor 402 is turned off. Alternatively, the body 405 may be connected to ground by the connection 404 (shown in phantom). In this configuration, the pixel structure shown in FIG. 4 may be suitable for use with an EL display device.

Figure 5:
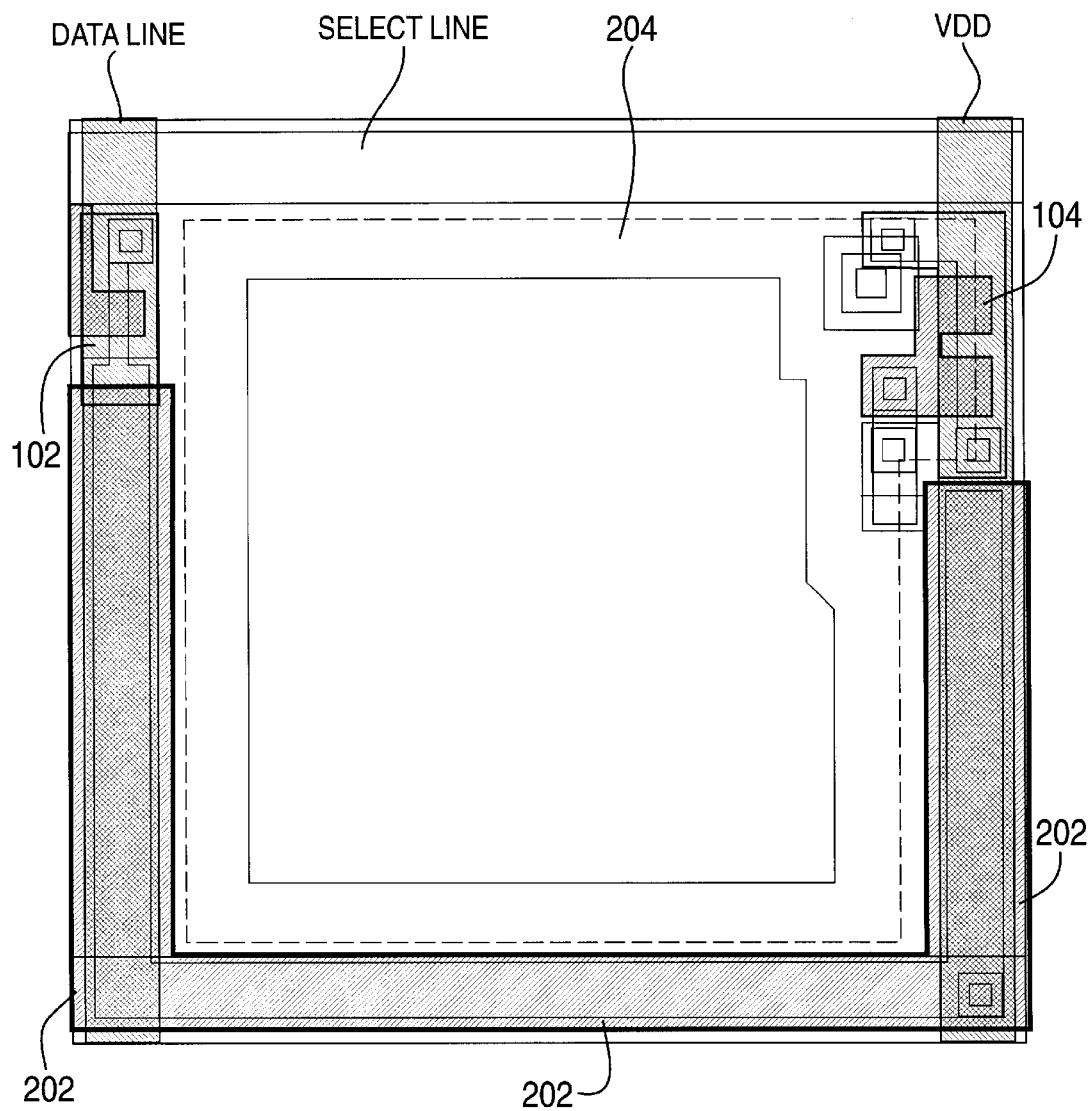
FIG. 5 is a top plan view of the pixel cell shown in FIG. 2.
Figure 6:
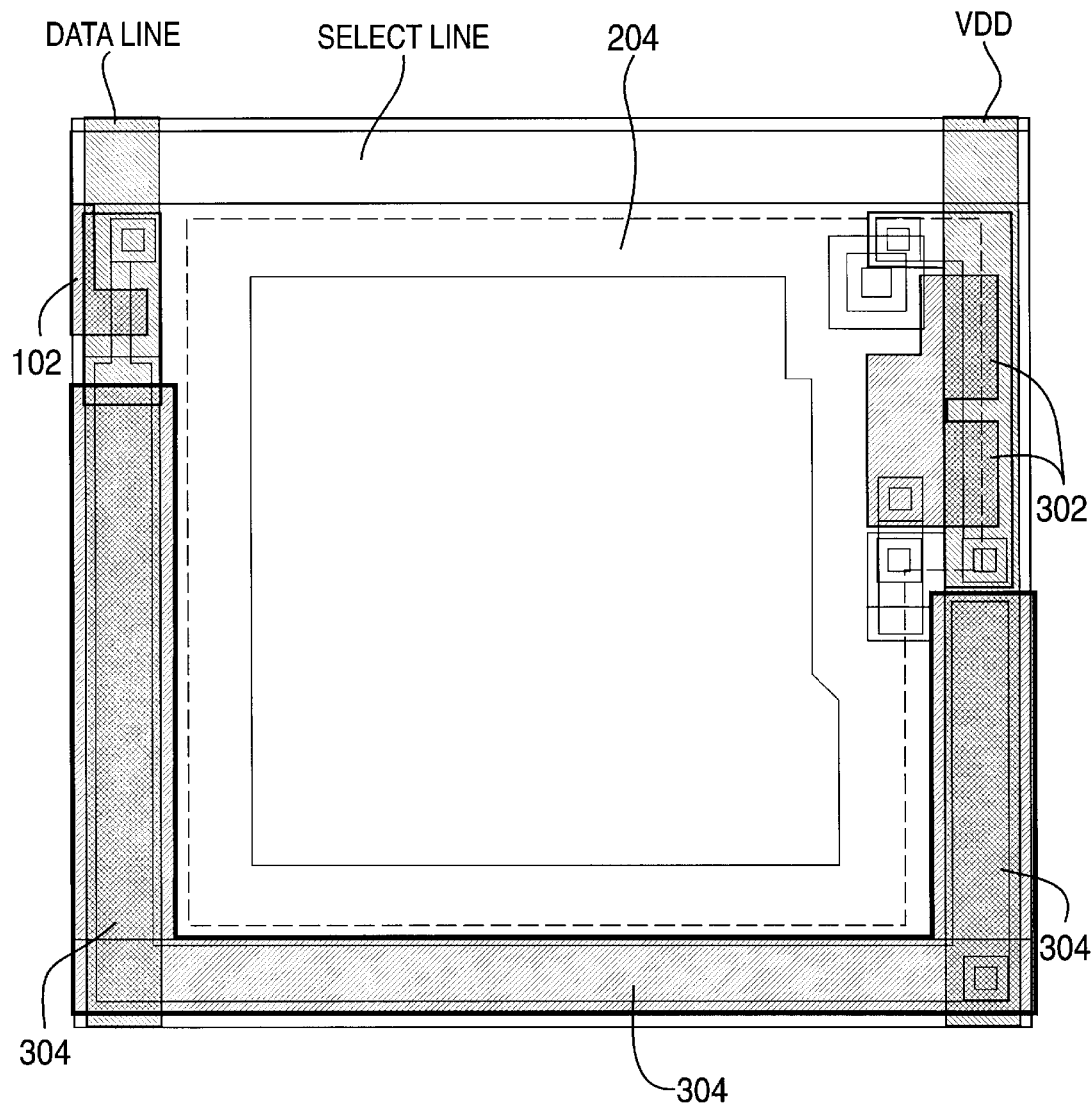
FIG. 6 is a top plan view of a pixel cell corresponding to one of the pixel structures shown in FIG. 3.
Figure 7:
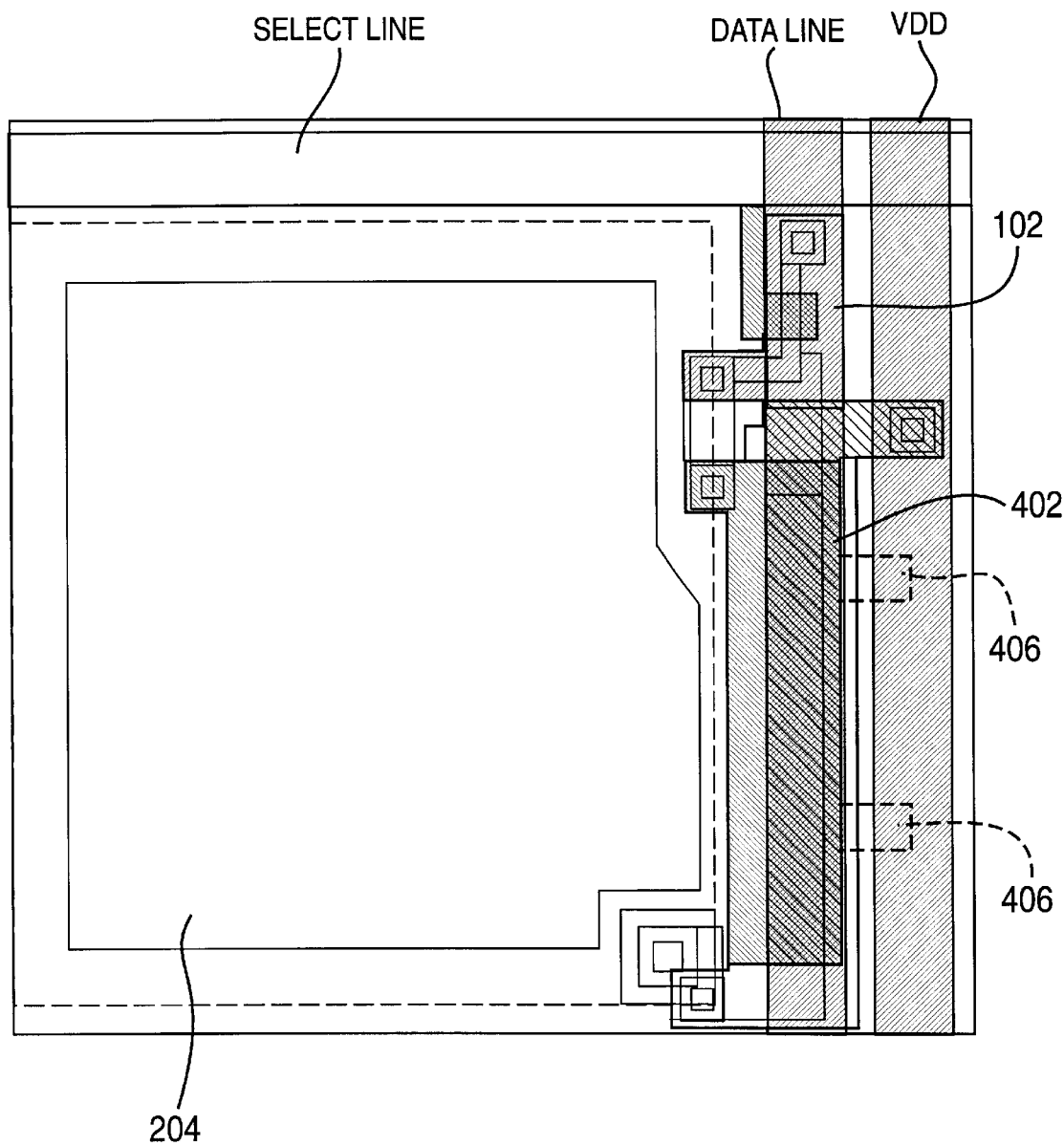
FIG. 7 is a top plan view of a pixel cell corresponding to other pixel structures shown in FIG. 3.

FIG. 5 is a top plan view of a pixel structure such as that shown in FIG. 2 while FIGS. 6 and 7 are top plan views of alternative pixel structures such as those shown in FIGS. 3 and 4, respectively. The structure shown in FIG. 6 employs the optional capacitor 304 while the structure shown in FIG. 7 does not. In addition, the structure shown in FIG. 7 illustrates the optional body connection 406 (shown in FIG. 4) that implements the turn-off capacitance between the gate electrode and the body of the TFT 402. It can be seen that the fill factor (ratio of light-emitting material to the total pixel area) remains substantially the same for all of the pixel structures while the drive transistors 302 in FIG. 6 and 402 in FIG. 7 are larger in area than the drive transistor 104 in FIG. 5. Conversely, the area occupied by the capacitor 304 of FIG. 6 is less than that occupied by the capacitor 108 of FIG. 5.

While the invention has been described in terms of an exemplary embodiment, it is contemplated that it may be practiced as outlined above within the scope of the appended claims.

What is claimed:

1. A method for implementing circuitry including polysilicon thin-film transistors (TFT's) according to a semiconductor process including the steps of:

analyzing the circuitry to identify TFT's that are sensitive to variations in gate to source threshold potential;

preparing a layout for the circuitry using design rules associated with the semiconductor process; and increasing each of the identified TFT's in size relative to other TFT's in the circuitry.

2. A method according to claim 1, wherein each of the TFT's in the layout has a length to width ratio and the step of increasing the identified TFT's in size preserves the length to width ratio of the identified TFT's.

3. A method according to claim 1, wherein the circuitry is the pixel structure of an active matrix display and the identified TFT's are the drive transistors of the pixel structure.

4. A pixel structure for an active matrix display comprising:

a drive transistor having a principal conduction path coupled between a source of operational power and an active pixel element, the drive transistor having a control electrode;

a select transistor having a principal conductive path between a data line and the control electrode of the drive transistor, and having a further control electrode coupled to a select line;

wherein the control electrode of the drive transistor has a size such that the control electrode exhibits sufficient capacitance to store a control value received from the data line via the select transistor, the stored control value causing the drive transistor to activate the active pixel element at a predetermined level of illumination for one image field interval.

5. A pixel structure according to claim 4, further including a capacitor, coupled between the control electrode of the drive transistor and the source of operational potential for storing the control value, wherein the stored control value is sufficient to hold the drive transistor in an inactive state for the image field interval.

6. A pixel structure according to claim 4 wherein the pixel structure is used in an active matrix organic light emitting diode (AMOLED) display and the charge value stored on the gate to source capacitance of the drive transistor controls the level of current that is applied to the organic light emitting diode (OLED) device.

7. A pixel structure according to claim 6 wherein the width to length ratio of the drive transistor is selected to provide a predetermined current level to the OLED device.

8. A pixel structure according to claim 7 wherein the control electrode of the drive transistor forms a capacitance with the principal conductive path of the drive transistor when the drive transistor conducts current and forms a capacitance with a further electrode coupled to a predetermined electric potential when the drive transistor is not conducting current.

9. A pixel structure according to claim 8 wherein the drive transistor is a thin film transistor and the further electrode is a ground plane.

10. A pixel structure according to claim 8, wherein the drive transistor is a metal oxide semiconductor (MOS) transistor formed on a substrate and the further electrode is the substrate.

11. A pixel structure for an active matrix display having thin-film transistors (TFT's) implemented in polysilicon comprising:

an active pixel element, a drive TFT having a source electrode coupled to a source of operational power and a drain electrode coupled to the active pixel element, the drive TFT having a control electrode and exhibiting a gate to source threshold potential;

a select TFT having a principal conductive path between a data line and the control electrode of the drive TFT, and having a further control electrode coupled to a select line; and a capacitor, coupled between the control electrode of the drive transistor and the source of operational power;

wherein the drive TFT occupies an area in the pixel structure that is sufficient to produce a variability in the gate to source threshold potential, among other pixels in the display, of less than 0.2 v.

12. A pixel structure according to claim 11, wherein the drive TFT is designed with a length to width ratio which produces a predetermined current response characteristic.

13. A pixel structure according to claim 12, wherein the active pixel element is an organic light emitting diode (OLED) device.

* * * * *